US012693320B2

(12) United States Patent　　　　　(10) Patent No.:　US 12,693,320 B2

Karlgaard et al.　　　　　　　　　　　(45) Date of Patent:　　　Jul. 28, 2026

---

(54) ELECTRIC METER

(71) Applicant: Landis+Gyr Technology, Inc.,
Alpharetta, GA (US)

(72) Inventors: Matt Karlgaard, Brainerd, MN (US);
John Voisine, Lafayette, IN (US);
Frank Boudreau, Otterbein, IN (US)

(73) Assignee: LANDIS+GYR TECHNOLOGY,
INC., Alpharetta, GA (US)

( * ) Notice: Subject to any disclaimer, the term of this
patent is extended or adjusted under 35
U.S.C. 154(b) by 221 days.

(21) Appl. No.: 18/299,839

(22) Filed: Apr. 13, 2023

(65) Prior Publication Data

US 2024/0345144 A1　　　Oct. 17, 2024

(51) Int. Cl.
G01R 22/06　　　　　(2006.01)
G01R 15/18　　　　　(2006.01)

(52) U.S. Cl.
CPC ........... G01R 22/065 (2013.01); G01R 15/18
(2013.01)

(58) Field of Classification Search
None
See application file for complete search history.

(56) References Cited

U.S. PATENT DOCUMENTS

| | | | | |
|---|---|---|---|---|
| 6,665,620 B1 * | 12/2003 | Burns | ..................... | G01D 4/002 |
| | | | | 379/106.01 |
| 10,948,516 B2 * | 3/2021 | Karlgaard | ............ | H01R 9/2433 |

| | | | | |
|---|---|---|---|---|
| 11,415,598 B2 * | 8/2022 | Karlgaard | .............. | G01R 21/06 |
| 11,428,710 B2 * | 8/2022 | Karlgaard | ............ | G01R 1/0416 |
| 11,506,693 B2 * | 11/2022 | Karlgaard | .............. | G01R 11/04 |
| 11,536,754 B2 * | 12/2022 | Ramirez | .......... | G01R 19/16538 |
| 12,385,956 B2 * | 8/2025 | Karlgaard | ............ | G01R 21/007 |
| 2008/0218154 A1 * | 9/2008 | Ashburn | .................. | G01D 3/08 |
| | | | | 324/119 |
| 2011/0242715 A1 * | 10/2011 | Voisine | .................. | G01D 4/004 |
| | | | | 361/65 |
| 2013/0293219 A1 * | 11/2013 | Ramirez | ................ | G01R 22/10 |
| | | | | 324/103 R |
| 2017/0271874 A1 * | 9/2017 | Luke | ......................... | H02J 3/32 |
| 2019/0227105 A1 * | 7/2019 | Minich | .............. | G01R 31/1272 |
| 2021/0048462 A1 * | 2/2021 | Ramirez | ................ | H02J 1/082 |
| 2021/0109142 A1 * | 4/2021 | Karlgaard | .............. | G01R 11/04 |
| 2021/0109143 A1 * | 4/2021 | Tanwani | .............. | H01R 13/113 |
| 2024/0345143 A1 * | 10/2024 | Karlgaard | .............. | G01R 21/07 |

OTHER PUBLICATIONS

International Preliminary Report on Patentablitlity for International
No. PCT/US2024/024203, dated Oct. 23, 2025, 6 pages.

* cited by examiner

*Primary Examiner* — Jermele M Hollington
(74) *Attorney, Agent, or Firm* — Tarolli, Sundheim,
Covell & Tummino LLP

(57)　　　　　　　ABSTRACT

The electric meter comprises: a line port for coupling to an
electric distribution power source; a load port for coupling
to a load; and an auxiliary port for coupling to at least one
distributed energy resource device; a processor circuit (205)
coupled to metrology components (210) for metering current
and/or voltage at one or more of the line port, the load port
and the auxiliary port and a power supply (220) configured
to provide power to the processor circuit, wherein the power
supply is configured to receive electrical power from the
auxiliary port and/or from the line port.

19 Claims, 4 Drawing Sheets

ELECTRIC METER

FIELD OF INVENTION

The present disclosure is in the field electric meters, and relates in particular to a multi-port electric meter having at least one auxiliary port for coupling to a distributed energy resource (DER) device, and wherein electrical power for the electric meter may be provided from one or more ports.

BACKGROUND TO INVENTION

Conventional electric meters comprise a line port that may be coupled to an electric distribution power source, e.g. the grid, and a load port for coupling to a load that consumes electrical power to be metered. However, the next generation of electric meters may additionally support connectively with further devices, such as Distributed Energy Resources devices through an additional port.

Distributed Energy Resources may be implemented as relatively small-scale electricity supply or demand resources that may be coupled to the electric grid. Examples of Distributed Energy Resource devices may include solar panels, generators, turbines, batter energy storage systems, electric vehicle batteries, and the like.

A general use of such Distributed Energy Resource devices is increasing, in particular by consumers at domestic premises, e.g. residential consumers, due to an increasing adoption of electric vehicles comprising battery storage systems and/or implementation of local energy generation and storage systems such as solar panels with associated battery storage systems.

An increase in a range of use cases of Distributed Energy Resource devices, and in particular to the use of local electricity generation and consumption, has led to increasingly varied use cases and demands on electric meter installations. For example, it may be required to couple multiple Distributed Energy Resource devices to an electric meter, wherein a flow of energy to be metered may be both to and from such Distributed Energy Resource devices.

That is, an electric meter may effectively be coupled to multiple power sources, e.g. the gird and one or more Distributed Energy Resource devices. In some instances, not all power sources may be energized simultaneously.

For example, in some use cases known in the art as "islanding", the electric meter may be effectively disconnected from the grid, and electrical power may flow from a Distributed Energy Resource device through the meter to another load, which may be another Distributed Energy Resource device, without any substantial power drawn from the grid port.

However, a power supply for the electric meter, e.g. for internal circuits of the electric meter, may conventionally be supplied from the line port, which may not always be sufficiently energized.

It is therefore desirable to provide an electric meter suitable for operation even when the line port is not sufficiently energized.

It is therefore an aim of at least one embodiment of at least one aspect of the present disclosure to obviate or at least mitigate at least one of the above identified shortcomings of the prior art.

SUMMARY OF INVENTION

The present disclosure is in the field electric meters, and relates in particular to a multi-port electric meter having at least one auxiliary port for coupling to a distributed energy resource device, and where electrical power for the electric meter may be provided from one or more ports.

According to a first aspect of the disclosure, there is provided an electric meter comprising: a line port for coupling to an electric distribution power source; a load port for coupling to a load; an auxiliary port for coupling to at least one distributed energy resource device; a processor circuit coupled to metrology components for metering current and/or voltage at one or more of the line port, the load port and the auxiliary port; and a power supply configured to provide power to the processor circuit wherein the power supply is configured to receive electrical power from the auxiliary port and/or from the line port.

That is, the power supply may be configured to receive electrical power from the line port in some scenarios described in more detail below, and from the auxiliary port in other scenarios, and in some instances from both the line port and the load port. That is, the electric meter may be connected to multiple power sources that may not simultaneously be energized, and advantageously the disclosed energy meter is capable of being powered from more than one source. Advantageously, such flexibility in the provision of electrical power to the power supply may support "islanding", wherein the line port that may conventionally provide electrical power to the power supply may not be energized.

In some embodiments, power consumption by the power supply may not be metered, e.g. not meter by the processor circuit.

That is, in the disclosed electric meter, when there is grid power available, the power supply should be energized using the grid power. The energy used to power the electric meter will not be charged to the customer. While the grid power is energized, the auxiliary port may also be energized, but the power supply should continue to be powered from grid power so that the customer does not pay for the power to energize the electric meter. Only when grid power goes away will the meter's power supply be powered from the auxiliary port, which may be the only remaining electrical power source.

Furthermore, the disclosed electric meter may be of significant benefit to the user, e.g. a homeowner, and may also be of benefit to the utility provider because the electric meter may allow for the utility provided to have visibility of the voltage conditions on the grid at the islanded meters. This may, for example, be beneficial for phase-synchronisation operations prior to coupling islanded ports to an energized line port.

When a voltage at the line port is above a threshold level, the power supply may receive at least a portion, or substantially all, of the electrical power from the line port.

That is, when the line port is energized, or at least energised to a sufficient voltage, the line port may provide electrical power to the power supply, e.g. the power supply for supplying power to electronics of the electric meter. In some embodiments, the threshold level may be defined by the power supply circuit. For example, the threshold level may correspond to a voltage level sufficient to operate the power supply, within an allowable tolerance.

When a voltage at the line port is at or below the threshold level, the power supply may receive at least a portion, or substantially all, of the electrical power from the auxiliary port.

That is, when the line port is not energized such as during a power outage or is effectively disconnected during an islanding operation, or at least when the line port is not energized to a sufficient voltage, the auxiliary port may provide electrical power to the power supply.

The electric meter may comprise a switch circuit configured to select the auxiliary port or the line port to provide electrical power to the power supply. The electric meter may comprise a control circuit for controlling the switch circuit.

The control circuit may be configured to trigger the switch circuit to select the auxiliary port to provide electrical power to the power supply if a voltage at the line port drops below a threshold level.

The control circuit may be coupled to the processor circuit and configured to receive an override signal from the processor circuit to control the switch circuit.

Advantageously, the processor circuit may be able to select the source of electrical power to be provided to the power supply, which may be useful for test purposes and may improve product reliability.

The electric meter may comprise a local power supply configured to supply electric power to the control circuit and/or the switch circuit. The local power supply may be configured to receive electrical power from the line port, from the auxiliary port, or from both the line port and the auxiliary port.

The power supply may comprise a switched-mode power supply.

The electric meter may comprise a plurality of auxiliary ports for coupling to respective distributed energy resource devices.

Advantageously, such an electric meter may support multiple Distributed Energy Resource devices, and may also enable significant levels of Distributed Energy Resource device disaggregation.

The electric meter may comprise a dual input bridge circuit having a first input coupled to the line port and a second input coupled to the auxiliary port.

A first power supply line coming from the line port and extending to the first input of the dual input bridge circuit may be coupled to a first primary winding in a current transformer of the line port.

A second power supply line coming from the auxiliary port and extending to the second input of the dual input bridge circuit may be coupled to a second primary winding in the current transformer of the line port.

A phase shift between the first primary winding and a secondary winding of the current transformer of the line port may be configured to be zero.

A phase shift between the second primary winding and the secondary winding of the current transformer of the line port may be configured to be 180°.

That is, the second power supply line coming from the auxiliary port may be routed through a window or aperture of the line port current transformer. By routing the wire back through the line port current transformer window or aperture, the power supply current may be effectively cancelled in the line port current transformer, and therefore does not impact any line port meter registration. With such a topology, any line port energy reading may accurately reflect the sum of the load port and auxiliary port energies, without being measurably influenced by a current provided to the power supply of the electric meter.

The power supply may comprise a rectifier circuit coupled to the line port and the auxiliary port. The rectifier circuit may be configured to operate as a full-wave rectifier when a voltage is present at both the line port and the auxiliary port. The rectifier circuit may be configured to operate as a half-wave rectifier when a voltage is present at only one of the line port and the auxiliary port.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF DRAWINGS

These and other aspects of the present disclosure will now be described, by way of example only, with reference to the accompanying drawings, wherein.

DETAILED DESCRIPTION OF DRAWINGS

Figure 1:
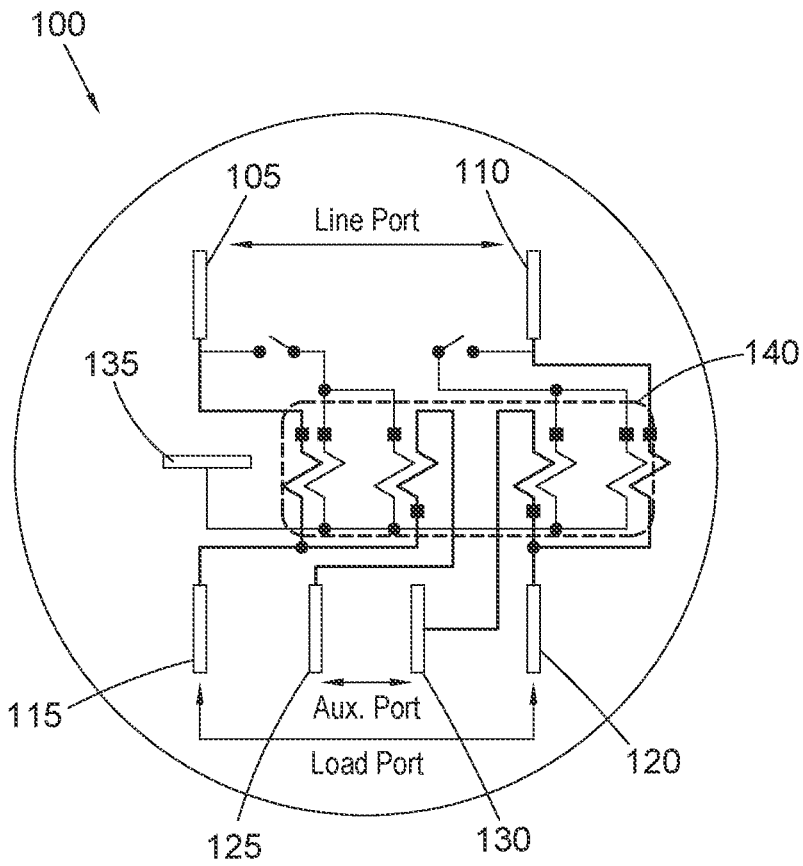
FIG. 1 depicts a representation of an example electric meter, according to an embodiment of the disclosure.

FIG. 1 depicts a block diagram of features of a multi-port electric meter 100, according to an embodiment of the disclosure. The representation depicts an example arrangement of a plurality of blades of the electric meter 100. It will be understood by one of skill in the art that FIG. 1 represents a simplified depiction of a multi-port electric meter 100 according to embodiments of the disclosure, primarily to depict an arrangement of the plurality of blades to provide a plurality of ports as described in more detail below. As such, features such as disconnect switches, e.g. controllable service disconnect switches, that may be present at any/all of the ports are omitted from FIG. 1 for simplicity of illustration. Such disconnect switches are depicted or represented in the embodiments of FIGS. 2, 3, 4 and 5, and described in more detail below.

Each blade is a conductor configured to be received by a corresponding receptacle of a meter socket, collar, adaptor, or the like (not shown).

The electric meter 100 comprises a line port for coupling to an electric distribution power source, e.g. the grid (not shown). That is, the plurality of blades are arranged to provide the line port, denoted "line port" in FIG. 1. The line port comprises a first blade 105 corresponding to a first phase of the electric distribution power source and a second blade 110 corresponding to a second phase of the electric distribution power source.

The electric meter 100 comprises a load port for coupling to a load, e.g. an electric power consuming device or appliance (not shown). That is, the plurality of blades are arranged to provide a load port, denoted "load port" in FIG. 1. The load port comprises a third blade 115 corresponding to a first phase of the load and a fourth blade 120 corresponding to a second phase of the load.

The electric meter 100 comprises an auxiliary port. In use, the auxiliary port may be suitable for coupling to a distributed energy resource device (not shown). That is, the plurality of blades are arranged to provide an auxiliary port, denoted "Aux. Port" in FIG. 1. The auxiliary port comprises a fifth blade 125 corresponding to a first phase of the auxiliary port and a sixth blade 130 corresponding to a second phase of the auxiliary port.

The plurality of blades comprise a seventh blade 135 for providing a neutral connection path.

It will be understood that the example multi-port electric meter 100 of FIG. 1 is provided for purposes of example only, and in other example embodiments falling within the scope of the disclosure a different configuration of ports may be support. For example, in some embodiments, the electric meter may comprise a further auxiliary port, which may be suitable for coupling to a further distributed energy resource device. Such a 'four-port meter" may support high levels of distributed energy resource device disaggregation and advanced islanding capabilities.

Furthermore, although seven blades are disclosed, it will be understood that embodiments of electric meters 100 according to the present disclosure may include more than or fewer than seven blades and corresponding receptacles respectively. For example, when only one voltage phase is connected fewer than seven blades may be included, since blades for additional phases may not be needed. Similarly, when three voltage phases are connected additional blades may be implemented.

Also depicted are the metrology components 140, with voltage transducers depicted with a relatively thin line, and current transducers depicted with a relatively bold line. It can be seen that in the example electric meter 100, each phase of the line port and the auxiliary port comprises a corresponding voltage transducer and a corresponding current transducer, e.g. a total of four current transducers and four voltage transducers.

Figure 2:
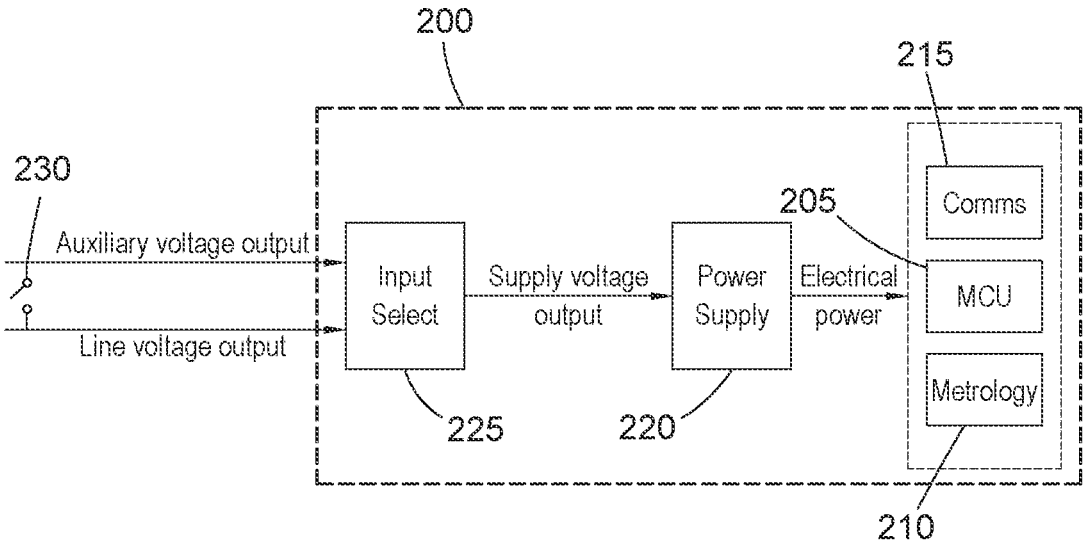
FIG. 2 depicts a block diagram of features of an electric meter, according to an embodiment of the disclosure.

Turning now to FIG. 2, there is depicted a block diagram of salient features of an electric meter 200, according to an embodiment of the disclosure. The electric meter 200 of FIG. 2 may be an example of the electric meter 100 of FIG. 1.

The example electric meter 200 comprises circuits which, in this example embodiment, include a processor circuit 205. The processor circuit 205 may comprise, for example, any of a microprocessor, a microcontroller (MCU), field programmable gate array (FPGA), application specific integrated circuit (ASIC) or the like. The processor circuit 205 may comprise discrete components. The processor circuit 205 may comprise various circuits or components required to support an implementation of a processor circuit, such as filtering, bulk storage, clocks, and the like.

The example electric meter 200 comprises metrology components 210. For example, the metrology components 210 may correspond to the metrology components 140 of the example electric meter 100 of FIG. 1.

An acquisition circuit (not shown) may be implemented for acquiring measurements such as voltage and/or current measurements from the metrology components 210, and for providing signals corresponding to such measurements to the processor circuit 205. Such an acquisition circuit may, for example, comprise any of: a analog to digital converter; a comparator; one or more voltage dividers; or the like. Such an acquisition circuit may be at least partly integrated into the processor circuit 205.

The example electric meter 200 comprises a communications module 215. The communications module 215 may be configured to enable communication with other meters and/or with a utility. The communications module 215 may be at least partly integrated into or coupled to the processor circuit 205.

The communications module 215 may be configured to communicate: wirelessly; via a cellular network; via power line communications; or the like. The communications module 215 may be configured to receive communications that include instructions for controlling one or more electrical disconnect switches (not shown) that may be implemented in the electric meter 200.

As an example use case, the communications module 215 may transmit data related to the operation of the electric meter 200, such as data corresponding to measurements performed by the above-described electrical metrology components 210.

The electric meter 200 comprises a power supply 220. The power supply 220 provides electrical power to the processor circuit 205. More generally, the power supply 220 may prove electrical power to various components of the electric meter 200, such as the above-described acquisition circuit, the communications module 210 and the like.

The power supply 220 may provide electrical power at a plurality of different voltages and/or with a range of current capabilities. In a non-limiting example, the power supply may provide a 12 volt supply and a 24 volt supply for use, directly or indirectly, by the processor circuit 205 and various other components within the electric meter 200. It will be understood that such voltages are provided for purposes of example only, and should not be considered limiting in scope.

The power supply 220 may comprise a plurality of power supplies and/or may be coupled to one or more further power supplies. For example, the power supply may receive an AC voltage directly or indirectly from one or more ports of the meter 200 (as described in more detail below) and may provide a direct-current supply. The power supply may comprise a rectifier.

The power supply 220 may step down a voltage of a supply. For example, an input AC power supply may be a 240 volt ac power supply, and the power supply may provide a relatively low voltage direct current supply.

The power supply 220 may, for example, comprise one or mode regulators, such as Low-Dropout Regulators (LDOs), for generating voltages suitable for use by electronic devices, such as a 5.0 volt, 3.3 volt, 2.6 volt, 1.8 volt supply, or less. It will be understood that such voltages are provided for purposes of example only, and should not be considered limiting in scope. In some example embodiments, the power supply 220 may comprise a switched-mode power supply.

In the example electric meter 200, the power supply 220 is configured to receive electrical power from the auxiliary port and/or from the line port. That is, the power supply 220 may be configured to receive electrical power from the line port in some scenarios described in more detail below, and from the auxiliary port in other scenarios, and in some instances from both the line port and the load port. That is, the electric meter may be connected to multiple power sources that may not simultaneously be energized, and advantageously the disclosed energy meter 200 is capable of being powered from more than one source. Advantageously, such flexibility in the provision of electrical power to the power supply 220 may support "islanding", wherein the line port that may conventionally provide electrical power to the power supply may not be energized.

The electric meter 200 comprises a switch circuit 225, denoted "input select" in FIG. 2, configured to select the auxiliary port or the line port to provide electrical power to the power supply 220. One example of operation of the switch circuit 225 is described with reference to FIG. 3, which depicts a block diagram of an input-select feature of the electric meter 200 of FIG. 2.

An auxiliary voltage input is provided from the auxiliary port. In an example, the auxiliary voltage input may correspond to one phase of a voltage supplied at the auxiliary port of the electric meter 100, 200.

A first protection circuit 305 may be provided to filter and/or suppress over/under voltages and/or noise on the auxiliary voltage input, and/or for electromagnetic compatibility compliance purposes. For example, such a first protection circuit 305 may comprise one or more surge protection components. Such components may comprise any of: a resistor string; a transient voltage surge suppressor diode; a varistor, such as a metal-oxide varistor (MOV); a bypass capacitor; an avalanche diodes; or the like. An output of the first protection circuit 305 may be a conditioned auxiliary voltage input.

In the example embodiment, the conditioned auxiliary voltage input is coupled to a local power supply 315.

A line voltage input is provided from the line port. In an example, the line voltage input may correspond to one phase of a voltage supplied at the line port of the electric meter 100, 200.

A second protection circuit 320 may be provided to filter and/or suppress over/under voltages and/or noise on the line voltage input, and/or for electromagnetic compatibility compliance purposes. For example, such a second protection circuit 320 may comprise one or more surge protection components. Such components may comprise any of: a resistor string; a transient voltage surge suppressor diode; a varistor, such as a metal-oxide varistor (MOV); a bypass capacitor; an avalanche diodes; or the like. An output of the second protection circuit 320 may be a conditioned line voltage input.

In the example embodiment, the conditioned line voltage input is coupled to the control circuit 310.

In the example embodiment, the conditioned line voltage input is also coupled to the local power supply 315.

It will be noted that the both the conditioned line voltage input and the conditioned auxiliary voltage input may provide electrical power to the local power supply 315. In an example, the conditioned line voltage input and the conditioned auxiliary voltage input may be combined as a single voltage supply to the local power supply 315, such as by placement of diode in the path of each of the conditioned line voltage input and the conditioned auxiliary voltage input before a node at which said inputs are combined.

In the example embodiment, the conditioned line voltage input and the conditioned auxiliary voltage input are provided as inputs to a switch circuit 325. The switch circuit 325 may be effectively configured to select the auxiliary port or the line port to provide electrical power to the power supply 220. That is, the switch circuit 325 may be configured to select either the conditioned line voltage input or the conditioned auxiliary voltage input as a supply voltage, denoted "supply voltage output" to be supplied to the power supply 220. The switch circuit 325 may, for example, comprise a relay or the like. In embodiments, the switch circuit 325 may, for example, comprise a solid-state switch, a triac, or the like.

The local power supply may comprise, for example, any of a rectifier and/or regulator, for generating a power supply for use by at least the control circuit 310, and optionally also the switch circuit 325. In a non-limiting example, the local power supply may provide a 12 volt direct-current supply to the control circuit and to the switch circuit. In the example embodiment, the control circuit 310 is configured to control the switch circuit.

In one example, the control circuit 310 may be configured to trigger the switch circuit 325 to select the auxiliary port to provide electrical power to the power supply if a voltage at the line port drops below a threshold level. The control circuit 310 may determine that the voltage at the line port drops below a threshold level by monitoring the conditioned line voltage input.

For example, the control circuit 310 may comprise a comparator, analogue to digital converter or the like, for comparing the conditioned line voltage input to a reference. The control circuit 310 may comprise a voltage divider for generating one or more voltage levels from the conditioned line voltage input, wherein the one or more voltage levels may, at least in part, define the threshold level and/or be used by the control circuit 310 to determine whether the voltage at the line port has dropped below a threshold level.

As such, when the voltage at the line port is above a threshold level, the power supply 220 may receive at least a portion, or substantially all, of the electrical power from the line port, e.g. from the conditioned line voltage input, and when the voltage at the line port is at or below the threshold level, the power supply 220 may receive at least a portion, or substantially all, of the electrical power from the auxiliary port, e.g. from the conditioned auxiliary voltage input.

Thus, when the line port is energized, or at least energised to a sufficient voltage, the line port may provide electrical power to the power supply 220. As described, in some embodiments the threshold level may be defined by the above-described control circuit 310. For example, the threshold level may correspond to a voltage level sufficient to operate the power supply 220, within an allowable tolerance.

In an example use case of the electric meter 100, 200, when the line port is not energized such as during a power outage or during an islanding event, or at least when the line port is not energized to a sufficient voltage, the auxiliary port may provide electrical power to the power supply 220.

In some examples, the processor circuit 205 may be configured to provide an override signal to the control circuit 310. The control circuit 310 may be configured to receive the override signal directly, or indirectly, from the processor circuit 205. The processor circuit 205 being able to select the source of electrical power provided to the power supply 220 may be useful for test purposes and may improve overall product reliability.

Figure 3:
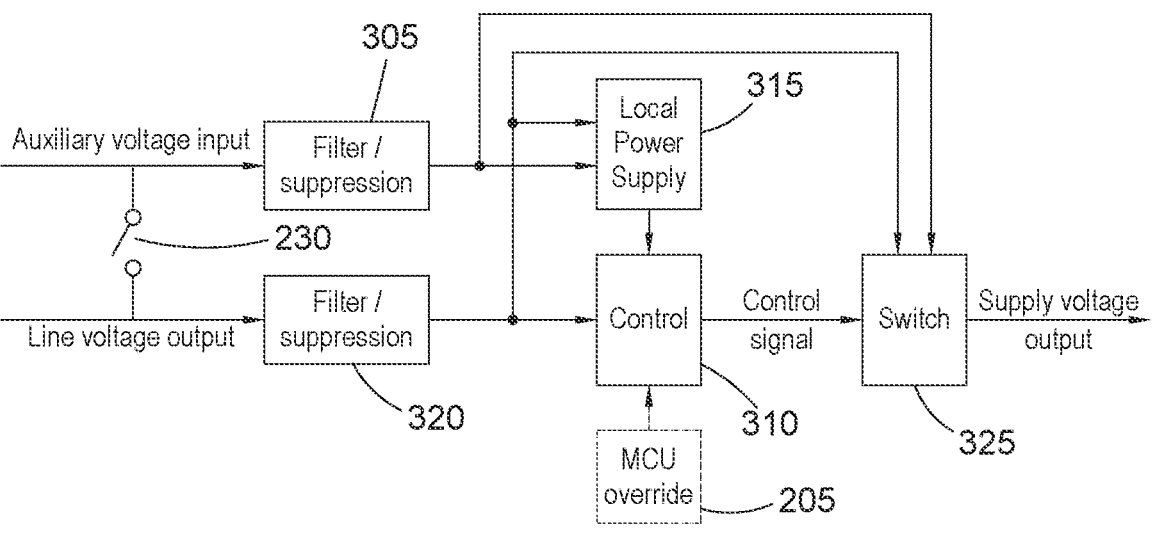
FIG. 3 depicts a block diagram of an input-select feature of the electric meter of FIG. 1, according to an embodiment of the disclosure.

Also depicted in the example embodiment of FIGS. 2 and 3 is a disconnect switch 230, for example a service disconnect switch. That is, the disconnect switch 230 selectively connects a flow of electrical power through the electric meter 200 between the line and auxiliary and load ports. It will be appreciated by one of skill in the art that the disconnect switch 230 as depicted in the block diagrams of FIGS. 2 and 3 may represent two switches in series.

Such disconnect switches may be configurable for effectively disconnecting the respective port from a respective source/load. In examples, both inputs, e.g. the Auxiliary (DER) voltage input and the Line voltage input may be connected to different sources and if one of the sources is in an outage state, the switch 230 may be opened to allow for powering from the source that is active.

Figure 4:
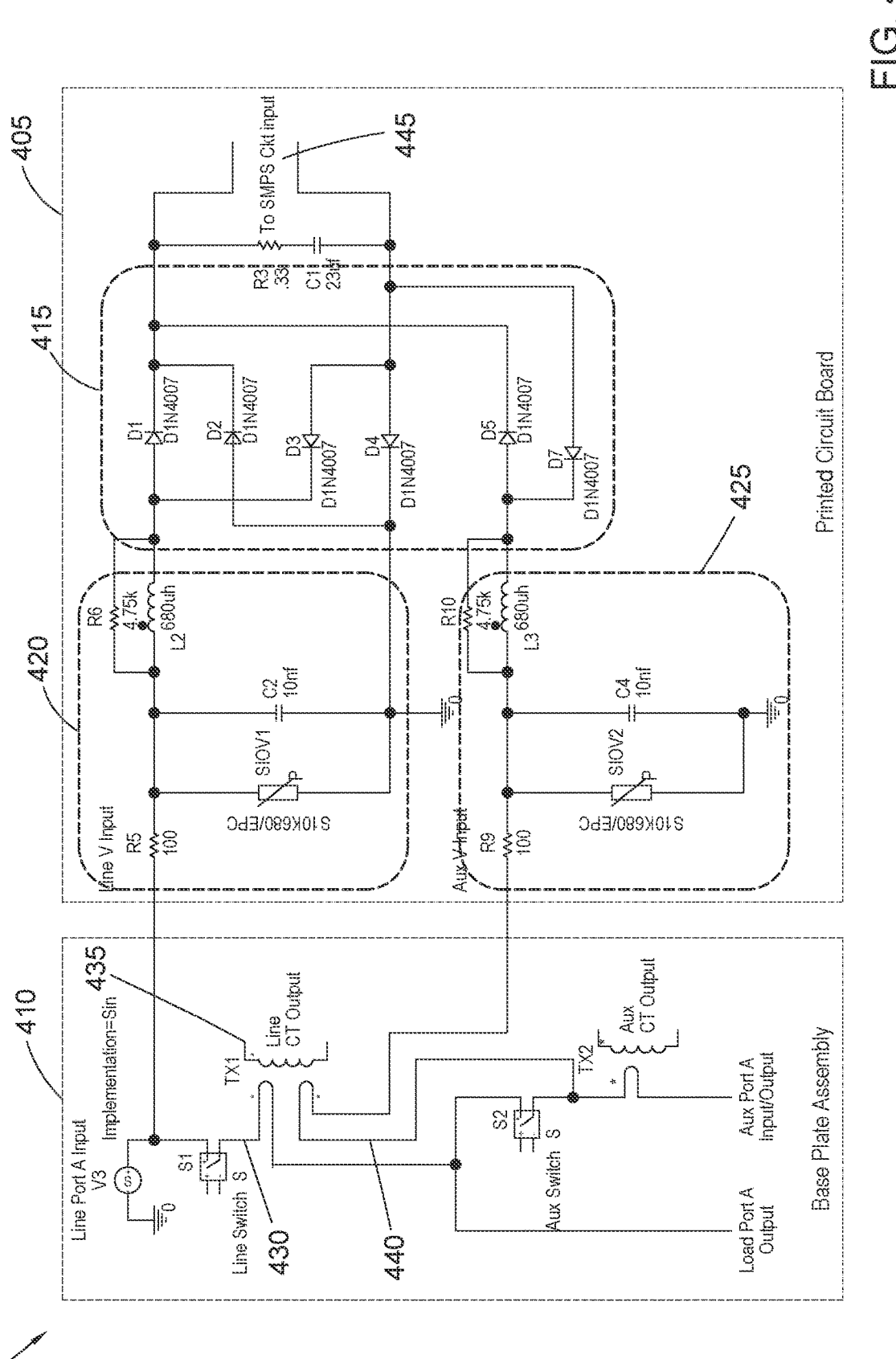
FIG. 4 depicts an example of a circuit for providing electrical power to a power supply of an electric meter, according to an embodiment of the disclosure.

FIG. 4 depicts an example of a circuit 400 for providing electrical power to a power supply 220 of an electric meter 200, according to an embodiment of the disclosure. The circuit 400 may be implemented in the meter 200 depicted in FIG. 2 as an alternative to the switch circuit 225.

As described in more detail below, in the disclosed circuit 400 a default is that if the line port is energized then electrical power is provided to the power supply 220 from the line port. However, in instances where the line port is not energized, the electrical power to the power supply 220 is instead provided from the auxiliary port. In the disclosed circuit 400, the electric meter 200 does not record or register energy needed to supply to the power supply 220. As such, the customer is not charged for energy to power the electric meter 200.

A printed circuit board 405 and a base plate assembly 410 are depicted. The printed circuit board 405 comprises circuitry for conditioning input voltages provided from the base plate assembly 410, as described in more detail below.

The base plate assembly 410 comprises metrology components, such as current transformers, which are also described in more detail below. The base plate assembly 410 may also comprise the blades, e.g. the blades 105, 110, 115, 120, 125, 130, 135 depicted in FIG. 1.

It will be noted that the partitioning of circuitry between the base plate assembly 410 and the printed circuit board 405 is provided solely for purposes of example, and is not to be considered as limiting the scope of the disclosure. For example, in other embodiments falling within the scope of the disclosure, components of the depicted circuits implemented on one of the printed circuit board or the base plate assembly may be implemented on the other of the printed circuit board or the base plate assembly, or collectively on a single substrate, or on additional substrate, e.g. one or more additional base plates or printed circuit boards.

In the example circuit, a power supply coupled to the grid is simulated by voltage supply V3, and is denoted "Line Port A Input". The "Line Port A Input" (hereafter referred to as the line port) may correspond to one phase of a voltage, e.g. "Phase A", supplied to the line port by the grid.

In the example circuit, an input/output coupled to the auxiliary port is denoted "Aux Port A Input/Output". The Aux Port A Input/Output (hereafter referred to as the auxiliary port) may correspond to one phase of a voltage at the auxiliary port.

The example circuit 400 comprises a dual input bridge circuit 415. The dual input bridge circuit 415 comprises a first input coupled to the line port, and a second input coupled to the auxiliary port.

That is, a bridge rectifier formed from diodes D1 to D4 is powered from the line port (from V3 which simulates the grid). Two additional diodes D5 and D7 provide an additional input to the bridge rectifier from the auxiliary port. Collectively, diodes D1 to D7 form the dual input bridge circuit 415.

An output 445 of the dual input bridge circuit 415 may be provided to a power supply 220 to the processor circuit 205.

Also depicted is first protection circuit 420 on a supply line from the line port and second protection circuits 425 on a supply line from the auxiliary port. The first and second protection circuits 420, 425 may filter and/or suppress over/under voltages and/or noise on the line port and the auxiliary port respectively. The first and second protection circuits 420, 425 may be examples of the first and second protection circuits 305, 320 of the embodiment of FIG. 3.

Also depicted is a switch, denoted "Line Switch" on a power supply line from the line port and a switch, denoted "Aux Switch" on power supply line from the auxiliary port. The line switch and the Aux Switch may be controllable electrical disconnect switches, such as a service disconnect switches. In some examples, the Line Switch and the Aux Switch may be controlled by the processor circuit 205. As a non-limiting example of practical usage of the electric meter 100, 200, the communications module 215 may be configured to receive communications that include instructions for controlling the Line Switch and/or the Aux Switch.

As described above, the circuit 400 comprises a dual input bridge circuit 415 having a first input coupled to the line port and a second input coupled to the auxiliary port.

In the example, a first power supply line 430 coming from the line port and extending to the first input of the dual input bridge circuit 415 is also coupled (via the Line Switch) to a first primary winding in the current transformer 435 of the line port.

A second power supply line 440 coming from the auxiliary port and extending to the second input of the dual input bridge circuit 415 is coupled to a second primary winding in the current transformer 435 of the line port.

As denoted by the dots on the current transformer 435 symbol of FIG. 4, a phase shift between the first primary winding and a secondary winding of the current transformer 435 of the line port is configured to be 0° or substantially 0°, and a phase shift between the second primary winding and the secondary winding of the current transformer 435 of the line port is configured to be 180°, or substantially 180°.

That is, the power supply line coming from the auxiliary port may be routed through a window or aperture of the line port current transformer 435. By routing the wire back through the line port current transformer 435 window or aperture, the power supply current may be effectively cancelled in the line port current transformer 435, and therefore does not impact any line port meter registration. With such a topology, any line port energy reading may accurately reflect the sum of the load port and auxiliary port energies, without being measurably influenced by a current provided to the power supply of the electric meter 100, 200. That is, in the example of FIG. 4, when the line port is energized, power for electric meter electronics, e.g. at least the processor circuit, may be shared between the line port and auxiliary port input. However, power supplied from the auxiliary port is not registered. That is, power that is used to provide electrical power for supply meter electronics through the auxiliary port is not recorded by the meter, and therefore a customer does not incur any costs for electrical power required to power the meter electronics.

In the example embodiment of FIG. 4, switch S1 may represent a disconnect switch, e.g. a controllable service disconnect switch, at the line port input.

Similarly, in the example embodiment of FIG. 4, switch S2 may represent a disconnect switch, e.g. a controllable service disconnect switch, at the auxiliary port input.

As described above, such disconnect switches are not depicted in the example embodiment of FIG. 1 for purposes of simplicity of illustration. It will, however, be understood by one of skill in the art that one or more ports of an electric meter falling within the scope of the disclosure may have an associated service disconnect switch implemented, e.g. a switch configurable to isolate the port from a load/source coupled to the port.

For example, implementation of such disconnect switches may be necessary to disconnect ports from loads/sources for a range of use cases and circumstances. As a non-limiting example, in the case of "islanding" where powering the meter electronics from an electrical power supply at the auxiliary port supply may be required, a disconnect switch such as switch S1 may be configured to disconnect the line.

Figure 5:
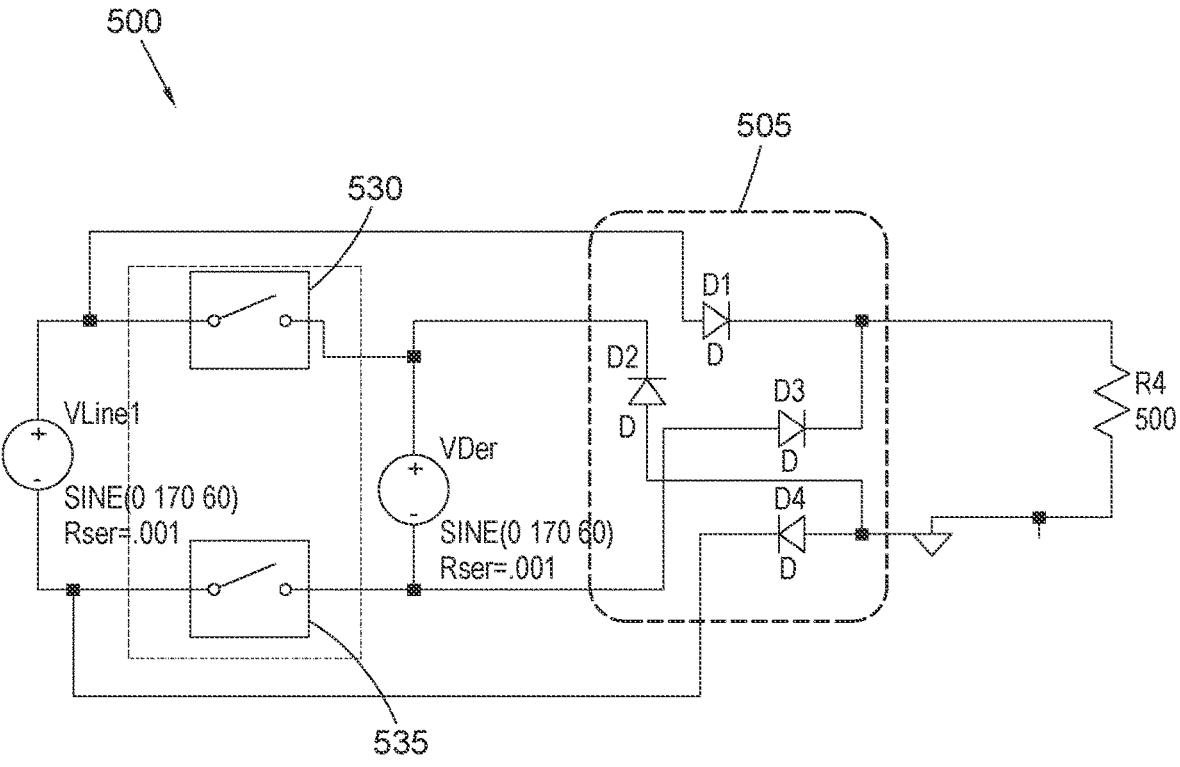
FIG. 5 depicts a further example of a circuit for providing electrical power to a power supply of an electric meter, according to an embodiment of the disclosure.

FIG. 5 depicts a further example of a circuit 500 that may provide electrical power to a power supply 220 for the processor circuit 205 of an electric meter 200, wherein said circuit 500 may couple a line port and an auxiliary port to the power supply input, as described in more detail below.

The circuit 500 may be implemented in the meter 200 depicted in FIG. 2 as an alternative to the switch circuit 225. Furthermore, the circuit 500 may be combined with the circuit 400 of FIG. 4, as described in more detail below.

The circuit 500 comprises a rectifier circuit 505 that derives power using both connections of the line port instead of from only one connection of the line port as depicted in FIG. 4.

In the example circuit 500, first switch 530 and second switch 535 are switches for both connections of the line port. Circuit 500 does not show a switch for either connection of the auxiliary port. For purposes of example, first switch 530 may substantially correspond to the disconnect switch S1 in the example embodiment of FIG. 4 for the first connection to the line port. Similarly, second switch 535 may represent a switch for the second connection to the line port. This second line port connection is not depicted in the example embodiment of FIG. 4.

In examples, first switch 530 may represent two switches in series between the Line and Auxiliary (DER) input (e.g. blade connection). Similarly, in a non-limiting example, second switch 535 may represent two switches in series for a line-line (240V) connection or would be a short e.g. not present, if it was the neutral connection of a line-neutral (120V) power supply.

"VLine1" is a voltage supply to simulate a voltage applies to the line port.

"VDer" is a voltage supply to simulate a voltage applies to the auxiliary port, and is intended to represent a distributed energy resource that may provide energy to the meter.

Resistor R4 merely represents a load, which was used for purposes of simulation to test the rectification capabilities of the circuit 500.

When the first switch 530 and the second switch 535 are open, and when both the line port voltage VLine 1 and the auxiliary port voltage VDer are present, the rectifier circuit 505 operates as a full-wave rectifier.

If either of the line port voltage VLine 1 and the auxiliary port voltage VDer are not present, then the rectifier circuit 505 operates as a half-wave rectifier.

That is, in a practical example, if there is power only from the auxiliary port, which may occur during an outage or if the service disconnect from the line is open, or during an islanding event, the rectifier circuit 505 operates as a half-wave rectifier.

Thus, a supply voltage provided by the circuit 500 to a power supply 220 may be half or full wave rectified. One benefit of the disclosed circuit 500 compared to the circuit 400 of FIG. 4 is the removal of two diodes, which may reduce overall costs of the electric meter 200. The power supply, e.g. power supply 220, which receives electrical power from the circuit 500 may be operable to receive both a full wave and a half wave rectified supply.

It will be appreciated that aspects of the circuit 500 of FIG. 5 may be combined with the circuit 400 of FIG. 4. For example, the circuit 500 of FIG. 5 may be adapted to include protection circuits, similar to first protection circuit 420 on the line port and second protection circuits 425 on the auxiliary port depicted in FIG. 4.

Furthermore, the disclosed technique of coupling an input from the line port to a first primary winding in a current transformer of the line port and also coupling an input from the auxiliary port a second primary winding in the same current transformer, with a phase shift of zero between the first primary winding and the secondary winding and a phase shift of 180° between the second primary winding and the secondary winding of the current transformer, may also be applied to the circuit 500 of FIG. 5.

Although the disclosure has been described in terms of particular embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in any embodiments, whether alone or in any appropriate combination with any other feature disclosed or illustrated herein.

LIST OF REFERENCE NUMERALS 100 electric meter
105 first blade
110 second blade
115 third blade
120 fourth blade
125 fifth blade
130 sixth blade
135 seventh blade
140 metrology components
200 electric meter
205 processor circuit
210 metrology components
215 communications module
220 power supply
225 switch circuit
230 disconnect switch
305 first protection circuit
310 control circuit
315 local power supply
320 second protection circuit
325 switch circuit
400 circuit
405 printed circuit board
410 base plate assembly
415 dual input bridge circuit
420 first protection circuit
425 second protection circuit
430 first power supply lead
435 current transformer
440 second power supply lead
445 output
500 circuit
505 rectifier circuit
530 first switch
535 second switch

The invention claimed is:

1. An electric meter (100, 200) comprising:
a line port for coupling to an electric distribution power source;
  a load port for coupling to a load;
  an auxiliary port for coupling to at least one distributed energy resource device;
  a processor circuit (205) coupled to metrology components (210) for metering current and/or voltage at one or more of the line port, the load port and the auxiliary port; and a power supply (220) configured to provide power to the processor circuit, wherein the power supply is configurable between receiving electrical power from the auxiliary port and receiving electrical power from the line port, wherein, when a voltage at the line port is above a threshold level, the power supply (220) receives at least a portion of the electrical power from the line port.

2. The electric meter (100, 200) of claim 1, wherein power consumption by the power supply (220) is not metered by the processor circuit (205).

3. The electric meter (100, 200) of claim 1 wherein, when a voltage at the line port is at or below the threshold level, the power supply (220) receives at least a portion of the electrical power from the auxiliary port.

4. The electric meter (100, 200) of claim 1, comprising:

a switch circuit (225, 325) configured to select the auxiliary port or the line port to provide electrical power to the power supply (220); and a control circuit (310) for controlling the switch circuit.

5. The electric meter (100, 200) of claim 4, wherein the control circuit (310) is configured to trigger the switch circuit (225, 325) to select the auxiliary port to provide electrical power to the power supply (220) if a voltage at the line port drops below a threshold level.

6. The electric meter (100, 200) of claim 4, wherein the control circuit (310) is coupled to the processor circuit (205) and configured to receive an override signal from the processor circuit to control the switch circuit (225, 325).

7. The electric meter (100, 200) of claim 4, comprising a local power supply (315) configured to supply electric power to the control circuit (310) and/or the switch circuit (225, 325), wherein the local power supply is configured to receive electrical power from both the line port and the auxiliary port.

8. The electric meter (100, 200) of claim 1, wherein the power supply (220) comprises a switched-mode power supply.

9. The electric meter (100, 200) of claim 1, comprising a plurality of auxiliary ports for coupling to respective distributed energy resource devices.

10. The electric meter of (100, 200) claim 1, comprising a dual input bridge circuit (415) having a first input coupled to the line port and a second input coupled to the auxiliary port.

11. The electric meter (100, 200) of claim 10, wherein a first power supply lead (430) coming from the line port and extending to the first input of the dual input bridge circuit (415) is also coupled to a first primary winding in a current transformer (435) of the line port.

12. The electric meter (100, 200) of claim 11, wherein a second power supply lead (440) coming from the auxiliary port and extending to the second input of the dual input bridge circuit (415) is coupled to a second primary winding in the current transformer (435) of the line port.

13. The electric meter (100, 200) of claim 12, wherein:

a phase shift between the first primary winding and a secondary winding of the current transformer (435) of the line port is configured to be zero; and a phase shift between the second primary winding and the secondary winding of the current transformer (435) of the line port is configured to be 180°.

14. The electric meter (100, 200) of claim 1, wherein the power supply (220) comprises a rectifier circuit (505) coupled to the line port and the auxiliary port, the rectifier circuit configured to:

operate as a full-wave rectifier when a voltage is present at both the line port and the auxiliary port; and operate as a half-wave rectifier when a voltage is present at only one of the line port and the auxiliary port.

15. An electric meter (100, 200) comprising:

a line port for coupling to an electric distribution power source;

a load port for coupling to a load;

an auxiliary port for coupling to at least one distributed energy resource device;

a processor circuit (205) coupled to metrology components (210) for metering current and/or voltage at one or more of the line port, the load port and the auxiliary port;

a power supply (220) configured to provide power to the processor circuit, wherein the power supply is configurable between receiving electrical power from the auxiliary port and receiving electrical power from the line port;

a switch circuit (225, 325) configured to select the auxiliary port or the line port to provide electrical power to the power supply (220); and a control circuit (310) for controlling the switch circuit, wherein the control circuit (310) is configured to trigger the switch circuit (225, 325) to select the auxiliary port to provide electrical power to the power supply (220) if a voltage at the line port drops below a threshold level.

16. An electric meter (100, 200) comprising:

a line port for coupling to an electric distribution power source;

a load port for coupling to a load;

an auxiliary port for coupling to at least one distributed energy resource device;

a processor circuit (205) coupled to metrology components (210) for metering current and/or voltage at one or more of the line port, the load port and the auxiliary port;

a power supply (220) configured to provide power to the processor circuit, wherein the power supply is configurable between receiving electrical power from the auxiliary port and receiving electrical power from the line port;

a switch circuit (225, 325) configured to select the auxiliary port or the line port to provide electrical power to the power supply (220);

a control circuit (310) for controlling the switch circuit, and a local power supply (315) configured to supply electric power to the control circuit (310) and/or the switch circuit (225, 325), wherein the local power supply is configured to receive electrical power from both the line port and the auxiliary port.

17. An electric meter (100, 200) comprising:

a line port for coupling to an electric distribution power source;

a load port for coupling to a load;

an auxiliary port for coupling to at least one distributed energy resource device;

a processor circuit (205) coupled to metrology components (210) for metering current and/or voltage at one or more of the line port, the load port and the auxiliary port;

a power supply (220) configured to provide power to the processor circuit, wherein the power supply is configurable between receiving electrical power from the auxiliary port and receiving electrical power from the line port;

a switch circuit (225, 325) configured to select the auxiliary port or the line port to provide electrical power to the power supply (220); and a control circuit (310) for controlling the switch circuit, wherein the power supply (220) comprises a switched-mode power supply.

18. An electric meter (100, 200) comprising:

a line port for coupling to an electric distribution power source;

a load port for coupling to a load;

an auxiliary port for coupling to at least one distributed energy resource device;

a processor circuit (205) coupled to metrology components (210) for metering current and/or voltage at one or more of the line port, the load port and the auxiliary port;

a power supply (220) configured to provide power to the processor circuit, wherein the power supply is configurable between receiving electrical power from the auxiliary port and receiving electrical power from the line port; and a dual input bridge circuit (415) having a first input coupled to the line port and a second input coupled to the auxiliary port.

19. An electric meter (100, 200) comprising:

a line port for coupling to an electric distribution power source;

a load port for coupling to a load;

an auxiliary port for coupling to at least one distributed energy resource device;

a processor circuit (205) coupled to metrology components (210) for metering current and/or voltage at one or more of the line port, the load port and the auxiliary port; and a power supply (220) configured to provide power to the processor circuit, wherein the power supply is configurable between receiving electrical power from the auxiliary port and receiving electrical power from the line port;

wherein the power supply (220) comprises a rectifier circuit (505) coupled to the line port and the auxiliary port, the rectifier circuit configured to:

operate as a full-wave rectifier when a voltage is present at both the line port and the auxiliary port; and operate as a half-wave rectifier when a voltage is present at only one of the line port and the auxiliary port.

\* \* \* \* \*